United States Patent [19]

Donovan

[11] Patent Number: 4,562,403
[45] Date of Patent: Dec. 31, 1985

[54] SYMMETRICAL DISCRIMINATOR AND DEMODULATOR

[76] Inventor: John S. Donovan, 16503 Santa Rosa, Detroit, Mich. 48221

[21] Appl. No.: 642,639

[22] Filed: Aug. 20, 1984

Related U.S. Application Data

[63] Continuation-in-part of Ser. No. 615,217, May 30, 1984.

[51] Int. Cl.$^4$ ............................................. H03D 3/26
[52] U.S. Cl. ................................. 329/103; 329/142; 329/204
[58] Field of Search ............... 329/102, 103, 104, 107, 329/140, 142, 204, 205 R, 206; 375/80, 94; 455/214, 337

[56] References Cited

U.S. PATENT DOCUMENTS

| | | | |
|---|---|---|---|
| 2,220,098 | 11/1940 | Guanella | 455/337 |
| 2,881,312 | 4/1959 | Ressler | 329/204 X |
| 3,281,701 | 10/1966 | Axe | 329/204 X |
| 3,992,674 | 11/1976 | Meyerhoff | 329/204 X |

Primary Examiner—Siegfried H. Grimm

[57] ABSTRACT

A symmetrical discriminator and demodulator having two radio wave tuned circuits disposed parallel. The discriminator and demodulator has a common grounding connection for one end of each radio wave tuned circuit. The opposite end of each tuned circuit is connected to a coupling capacitor to couple the tuned circuit to a demodulator. Two pairs of diodes are connected to each capacitor, the two pairs of diodes being connected together in a head to tail fashion in a crossover figure-8 arrangement. The alternate junctures of said diode pairs are connected to two output coupling capacitors to provide a demodulated signal output. The symmetrical arrangement permits the use of extremely sensitive MOS-FETs in discriminator and demodulator circuitry.

9 Claims, 3 Drawing Figures

SYMMETRICAL DISCRIMINATOR AND DEMODULATOR

CROSS-REFERENCE TO RELATED APPLICATION

This application is a continuation in part of U.S. patent application Ser. No. 615,217, filed May 30, 1984, entitled "SMALL SIGNAL AMPLIFIERS".

BACKGROUND AND SUMMARY OF THE INVENTION

When utilizing metal oxide semiconductor field effect transistors (MOS-FETs) it is general knowledge that as amplifiers, they are limited to small signal situations. It is also known that, when they are structured as depletion type devices, their ability to amplify incoming signals is not restricted to the reversed biased range of their gate to source voltage handling limitations; indeed, they will tolerate temporary excursions into the forward biased range of the handling limitation without degrading the impedance between the gate and source.

This characteristic makes possible a zero-biased arrangement of the MOS-FETs for signal amplification. It is also possible to structure the MOS-FETs in a push-pull arrangement so that their performance potentional can be maximized in light of the latest technological developments for manufacturing said devices.

The fact that the transconductance of MOS-FET transistors increase proportionally to the onresistance, would make it desirable to structure the channel's cross-sectional dimensions as small as possible. The recent application of lasers in the manufacturing of such devices can reduce the channel dimensions to much less than one micron, with a high degree of consistency in maintaining the dimensions.

It is an object of the invention to utilize MOS-FETs manufactured by laser technology to their maximum potential in various circuit arrangements. Such circuit arrangements permit a large increase in transistor performance, the increased performance being a result of the circuit's ability to process an incoming signal despite the internal noise inherent in small signal amplifiers.

One possible use of such circuitry is in an FM demodulator when a de-emphasis circuit is included. Such circuitry may also be used as a radar or sonar demodulator including automatic frequency control and squelch circuits, but without the need for de-emphasis and limiting circuits.

It is the intent of this disclosure to bring to general knowledge a completely symmetrical discriminator and demodulator circuit.

It is a further intent of this disclosure to bring to general knowledge a completely symmetrical discriminator and demodulator circuit which includes an extremely sensitive and symmetrical limiter or squelcher.

It is a still further intent of this disclosure to bring to general knowledge a completely symmetrical discriminator and demodulator circuit which includes automatic frequency control.

It is an even further intent of this disclosure to bring to general knowledge a completely symmetrical discriminator and demodulator circuit which includes a symmetrical first stage analog amplifier and a volume control. It is yet another intent of this disclosure to bring to general knowledge a complete symmetrical discriminator and demodulator circuit which includes a symmetrical de-emphasizing function when utilized as an FM demodulator.

DETAILED DESCRIPTION

In the following detailed description, certain specific terminology will be utilized for the sake of clarity and a particular embodiment described in accordance with the requirements of 35 USC 112, but it is to be understood that the same is not intended to be limiting and should not be so contrued inasmuch as the invention is capable of taking many forms and variations within the scope of the appended claims.

Figure 1:
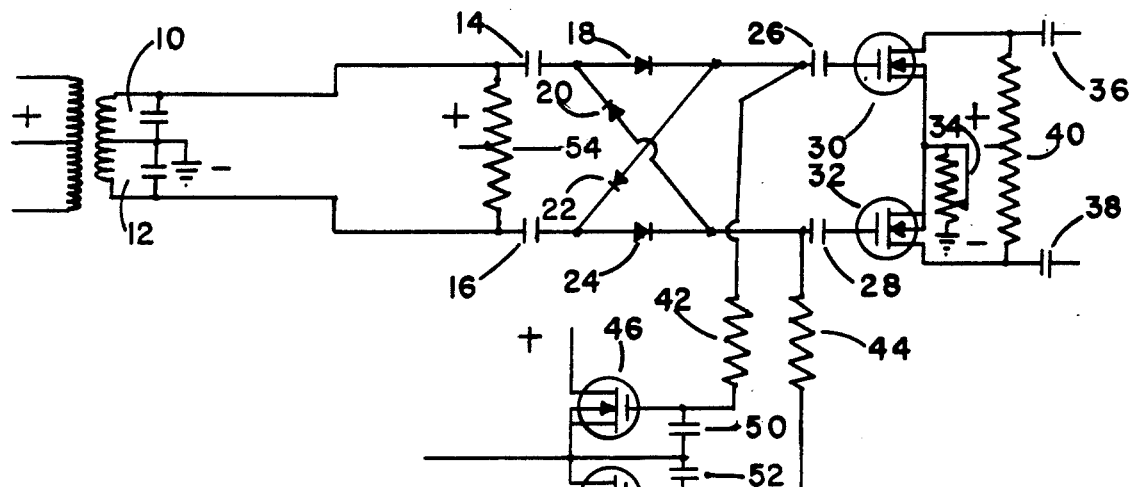
FIG. 1 is a schematic drawing of the common components of the symmetrical discriminator and demodulator circuitry of the present invention.

Referring to FIG. 1 the common components of the discriminator and symmetrical demodulator are identified by the same set of numbers. Two radio wave tuned circuits 10 and 12, one tuned slightly above the incoming signal from the intermediate frequency amplifiers (not shown) and the other tuned sightly below the incoming signal from the intermediate frequency amplifiers, provide an input signal to the circuit. Coupling capacitors 14 and 16 transfer the input signal from the input stage to the demodulating stage. Diodes 18 and 20 operate in conjunction with capacitor 14 while diodes 22 and 24 operate in conjunction with capacitor 16 to create a push-pull demodulator. Capacitors 26 and 28 couple the demodulated signal to transistors 30 and 32 of the first analog amplifying stage. These transistors, in cooperation with load resistor 40, transfer the analog signal to the next amplifying stage (not shown) through coupling capacitors 36 and 38. Resistor 34 serves as a volume control for the first analog amplifier. Resistors 42 and 44 are for tapping a small portion of the demodulated signal in order that any imbalance in the signal may be used to alter the specific voltage between transistors 46 and 48. This voltage is what determines the frequency of the local oscillator and therefore can be used to correct any imbalance in the demodulator portion of the configuration. Capacitors 50 and 52 are for stabilizing the voltage surges from the demodulator. Load resistor 54 is to aid the coupling capacitors 14 and 16.

Figure 2:
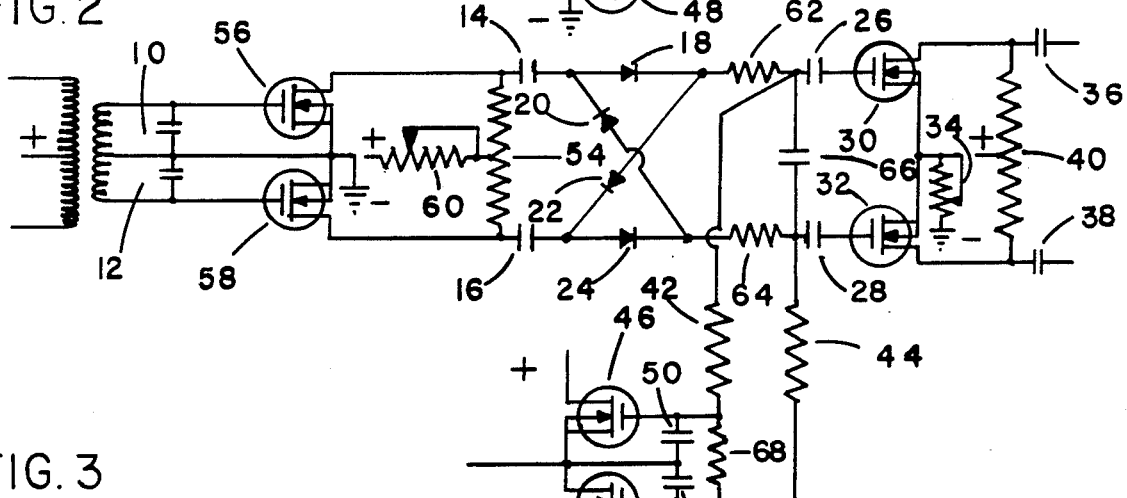
FIG. 2 is a schematic drawing of the present invention when used in a FM receiver.

Referring to FIG. 2, the circuit of FIG. 1 is used as an FM demodulator. Disposed between the radio wave tuned circuit 10 and the coupling capacitor 14, and between the radio wave tuned circuit 12 and the coupling capacitor 16, are transistors 56 and 58 respectively. The voltage drop across these transistors can be reduced to such a small amount by the calibrating resistor 60 that the input electrodes of the transistors are able to swing to a more positive polarity than are the drains of the transistors 56 and 58 thus saturating them. This clips the voltage surges to the coupling capacitors 14 and 16. The negative swing at the input electrodes of the transistors 56 and 58 is beyond the pinch-off voltage due to the extreme sensitivity of the transistors. This effectively eliminates any variations in signal strength to the demodulator stage. Resistors 62 and 64 in combination with capacitor 66 represent the de-emphasis circuit within the demodulator stage. As this configuration is for continuous radio wave reception, a bleed resistor 68 is included to prevent either transistor 46 or 48 from being pushed beyond pinch-off voltage.

Figure 3:
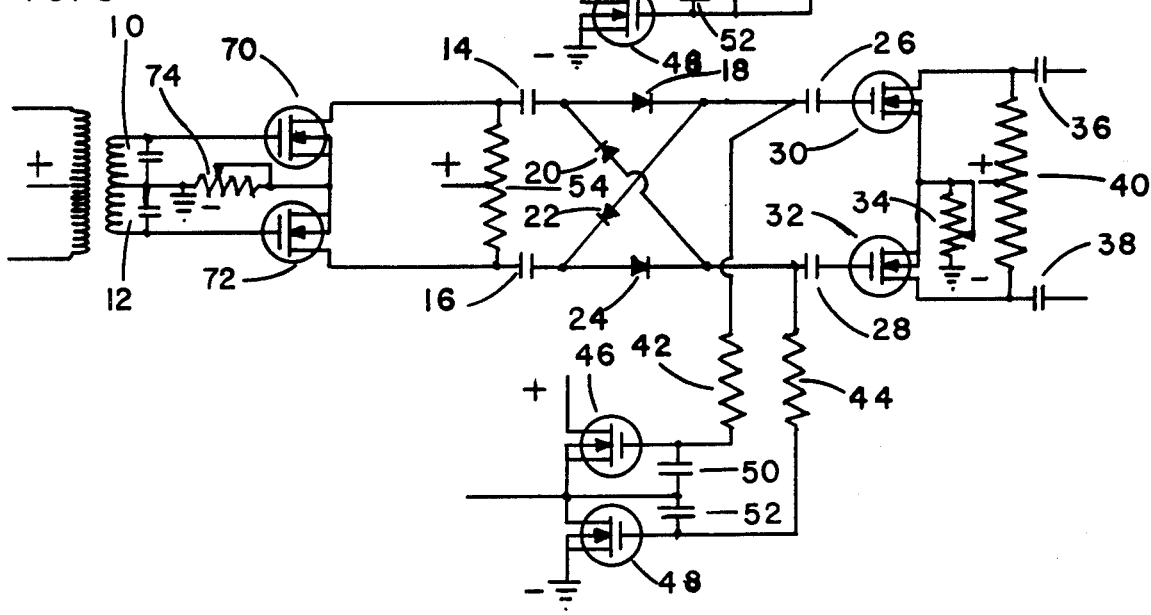
FIG. 3 is a schematic drawing of the present invention when used with a radar or sonar receiver.

Referring to FIG. 3 the circuit of FIG. 1 is modified for use in a radar or sonar detector. Disposed between the radio wave tuned circuit 10 and the coupling capacitor 14, and between the radio wave tuned circuit 12 and the coupling capacitor 16, are transistors 70 and 72 respectively. These transistors are biased beyond their pinch-off points by calibrating resistor 74 in order to prevent any outside noise from continuously or intermittently activating the demodulator circuit and therefore any succeeding analog amplifying stages. As this configuration is for a non-FM application the de-emphasis circuit has been omitted. Bleed resistor 68 is not needed as this configuration is for a non-continuous wave receiver.

I claim:

1. A symmetrical discriminator and demodulator comprising:
    two radio wave tuned circuits disposed in parallel having a common grounding connection for one end of each radio wave tuned circuit, the opposite end of each radio wave tuned circuit being connected to a coupling capacitor to couple the tuned circuit to a demodulator; and
    a pair of diodes connected to each capacitor, the two pairs of diodes being connected together in a head to tail fashion in a cross over figure eight arrangement; the alternate junctures of said diode pairs being connected to two output coupling capacitors to provide a demodulated signal output.

2. The symmetrical discriminator and demodulator of claim 1 wherein a resistor is disposed between each of said alternate junctures and said output coupling capacitors; and wherein a capacitor is disposed between said resistors on the output coupling capacitor side of said resistors.

3. The symmetrical discriminator and demodulator of claim 1 wherein an automatic frequency stabilizing circuit is tapped into each of said alternate junctions.

4. The symmetrical discriminator and demodulator of claim 3 wherein said automatic frequency stabilizing circuit includes a tapping resistor connected to each of said alternate junctures; and
    means are included for connecting said tapping resistors to the input electrodes of two sequentially arranged voltage controlling transistors.

5. The symmetrical discriminator and demodulator of claim 4 wherein two capacitors are connected between the input electrodes of said voltage controlling transistors and the point of juncture of their sequential arrangement.

6. The symmetrical discriminator and demodulator of claim 5 wherein a resistor is connected between the input electrodes of said sequentially arranged voltage controlling transistors.

7. The symmetrical discriminator and demodulator of claim 1 wherein a center-tapped positively polarized resistor is disposed between said opposite ends of said radio wave tuned circuits.

8. The symmetrical discriminator and demodulator of claim 7 wherein two source end grounded transistors are disposed between said opposite ends of the two radio wave tuned circuits; and a variable resistor is connected to said center-tap of said positively polarized resistor.

9. The symmetrical discriminator and demodulator of claim 7 wherein two source connected transistors are grounded through a common variable resistor, said transistors being disposed between said opposite ends of the two radio wave tuned circuits and said coupling capacitors.

* * * * *